(12) United States Patent
Takamori

(10) Patent No.: US 9,992,874 B2
(45) Date of Patent: Jun. 5, 2018

(54) METAL FOIL WITH CARRIER

(75) Inventor: Masayuki Takamori, Tokyo (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 172 days.

(21) Appl. No.: 13/132,766

(22) PCT Filed: Mar. 10, 2009

(86) PCT No.: PCT/JP2009/054482
§ 371 (c)(1),
(2), (4) Date: Jun. 3, 2011

(87) PCT Pub. No.: WO2010/073745
PCT Pub. Date: Jul. 1, 2010

(65) Prior Publication Data
US 2011/0244255 A1 Oct. 6, 2011

(30) Foreign Application Priority Data

Dec. 24, 2008 (JP) ................. 2008-327457

(51) Int. Cl.
*B32B 15/01* (2006.01)
*H05K 3/02* (2006.01)
*H05K 3/46* (2006.01)

(52) U.S. Cl.
CPC .......... *H05K 3/025* (2013.01); *H05K 3/4652* (2013.01); *H05K 2203/0152* (2013.01); *H05K 2203/0285* (2013.01); *Y10T 428/31678* (2015.04)

(58) Field of Classification Search
None
See application file for complete search history.

(56) References Cited

U.S. PATENT DOCUMENTS 3,932,250 A * 1/1976 Sato et al. ............... 156/213
4,591,087 A * 5/1986 Frasch .............. B23K 20/106
156/580.2

(Continued)

FOREIGN PATENT DOCUMENTS

EP   1152070 A1 * 11/2001
JP   06252554 A  *  9/1994

(Continued)

OTHER PUBLICATIONS

English machine translation (IPDL) JP2007186797 (2007).*

(Continued)

*Primary Examiner* — Kenneth J Stachel
(74) *Attorney, Agent, or Firm* — Howson & Howson LLP

(57) ABSTRACT

Provided is a metal foil with a carrier as a laminated body in which a carrier A and a metal foil B are placed alternately, wherein the carrier A and the metal foil B respectively have a glossy surface, so-called 'S surface', and the said surfaces are laminated to face each other. The present invention relates to a copper foil with a carrier which is used for producing a single-sided laminated plate or a multilayer laminated plate of two or more layers for use in a printed wiring board. In particular, this copper foil with a carrier is used for producing a laminated plate, and its objective is to improve the handling performance during the production process of a printed board and reduce costs by increasing the yield.

5 Claims, 2 Drawing Sheets

(56) References Cited

U.S. PATENT DOCUMENTS

| | | |
|---|---|---|
| 5,153,050 A | 10/1992 | Johnston |
| 5,674,596 A | 10/1997 | Johnston |
| 5,685,970 A | 11/1997 | Ameen et al. |
| 5,942,314 A | 8/1999 | Fisher et al. |
| 5,977,628 A * | 11/1999 | Moriga .................. H01L 21/50 257/704 |
| 6,202,915 B1 * | 3/2001 | Sato ....................... B23K 20/10 156/73.1 |
| 6,541,126 B1 * | 4/2003 | Yoshioka et al. ............. 428/624 |
| 6,610,418 B1 | 8/2003 | Yoshioka et al. |
| 6,638,642 B2 | 10/2003 | Kitano et al. |
| 6,833,198 B2 | 12/2004 | Sakamoto et al. |
| 6,835,241 B2 | 12/2004 | Tsuchida et al. |
| 6,960,391 B2 | 11/2005 | Natsume et al. |
| 7,341,796 B2 | 3/2008 | Hanafusa |
| 7,790,269 B2 | 9/2010 | Suzuki et al. |
| 2001/0030122 A1 | 10/2001 | Hara et al. |
| 2002/0182432 A1 | 12/2002 | Sakamoto et al. |
| 2004/0053019 A1 | 3/2004 | Yamamoto et al. |
| 2004/0163842 A1 | 8/2004 | Okada et al. |
| 2004/0209109 A1 | 10/2004 | Tsuchida et al. |
| 2004/0211751 A1 * | 10/2004 | Shuto et al. ..................... 216/13 |
| 2004/0253473 A1 * | 12/2004 | Weekes et al. ............... 428/595 |
| 2005/0158574 A1 | 7/2005 | Suzuki et al. |
| 2006/0068184 A1 | 3/2006 | Hamada et al. |
| 2008/0038522 A1 | 2/2008 | Hamada et al. |
| 2008/0196718 A1 | 8/2008 | Connell et al. |
| 2009/0162685 A1 | 6/2009 | Kobayashi et al. |
| 2009/0208762 A1 | 8/2009 | Akase |
| 2009/0305076 A1 * | 12/2009 | Wong .................. H01L 21/6835 428/607 |
| 2010/0018273 A1 | 1/2010 | Sato |
| 2010/0040873 A1 | 2/2010 | Kohiki et al. |
| 2010/0051451 A1 | 3/2010 | Sato |
| 2010/0212941 A1 | 8/2010 | Higuchi |
| 2010/0215982 A1 | 8/2010 | Kohiki et al. |
| 2010/0221563 A1 | 9/2010 | Kohiki et al. |
| 2010/0261033 A1 | 10/2010 | Moriyama et al. |
| 2010/0279069 A1 | 11/2010 | Hanafusa |
| 2010/0323215 A1 | 12/2010 | Makino |
| 2011/0003169 A1 | 1/2011 | Makino et al. |

FOREIGN PATENT DOCUMENTS

| | | |
|---|---|---|
| JP | 08-157621 A | 6/1996 |
| JP | 11-277562 A | 10/1999 |
| JP | 2002-134877 A | 5/2002 |
| JP | 2004-031802 A | 1/2004 |
| JP | 2005-161840 A | 6/2005 |
| JP | 2007-186797 A | 7/2007 |

OTHER PUBLICATIONS

English machine translation JP 06-252554 (1994).*
Fusion Mechanism During Ultrasonic Spot Welding_ Kreye_ SciFinder Caplus, Acc_No_ 1977_46436 (1975).*
Kong_Soar_Dickens_IMECHE_Proc_C_2005.*

* cited by examiner

METAL FOIL WITH CARRIER

BACKGROUND OF THE INVENTION

The present invention relates to a copper foil with a carrier that is used in producing a single-sided or multilayer laminated plate of two or more layers for use in a print wiring board.

A typical example of a multilayer laminated body is a printed circuit board. Generally, a printed circuit board is basically configured from a dielectric material referred to as a "prepreg" that is obtained by impregnating synthetic resin in a base material such as a synthetic resin plate, glass plate, nonwoven glass fabric or paper.

A sheet such as a copper or copper alloy foil having electrical conductivity is bonded to the prepreg surface, and to both of the front and back surfaces. A laminate that is assembled as described above is generally referred to as a CCL, namely, a Copper Clad Laminate material. When copper foils are multi-layered on the CCL material with use of the prepreg, this is referred to as a multilayer board.

Other foils made of aluminum, nickel, zinc or the like may also be used in substitute for the copper or copper alloy foil. The foil thickness is roughly 5 to 200 μm.

In the foregoing process, a copper foil with a carrier is used for the purpose of preventing the adhesion of foreign matter on the surface of the copper foil and for the purpose of improving the handling ability.

For example, in the method of producing a four-layer substrate using a conventionally known copper foil with a carrier (refer to Patent Documents 2, 3, 4), an ultrathin copper foil to which a carrier is peelably bonded is mounted on a stainless pressing plate called "mirror plate") having a flat pressing surface with a thickness of 0.2 to 2 mm so that the M surface is on top ('M surface' as used herein represents 'rough surface', and both of the expressions are used interchangeably hereinafter), subsequently a prescribed number of prepregs, subsequently a printed circuit board in which a circuit is formed on a CCL material referred to as the inner layer core, subsequently a prepreg, and subsequently an ultrathin copper foil to which a carrier is peelably bonded are mounted so that the M surface is at the bottom, and by laminating these in the order of the mirror plate, an assembled unit configured from one set of a four-layer substrate material is thereby complete.

Subsequently, these units called "pages" are repeatedly laminated 2 to 10 times to configure a press assembly called "book". Subsequently, the foregoing book is placed on a hot plate in the hot press and subject to compression molding at a prescribed temperature and pressure to produce a laminated plate. Substrates with four or more layers can be produced by a similar process by increasing the number of layers of the inner layer core.

Here, with the copper foil with a carrier to be used, since the ultrathin copper foil and the carrier are bonded across the entire surface, there is a problem in that considerable force is required for the worker to peel the carrier after lamination, and this is troublesome for the worker.

In addition, as described above, upon performing the lay-up operation, lamination assembly operation, in other words, the worker needs to alternatively repeat the process of lamination so that the M surface of the copper foil is on top or the M surface is at the bottom, and there is a problem in that the work efficiency will deteriorate. Moreover, since the copper foil and the carrier are of the same size, it is difficult to peel one copper foil at a time during the lay-up, which is also a problem in that the workability deteriorates on this point.

Furthermore, as described in Patent Document 1, upon producing a circuit board using CAC having a structure in which a copper foil is bonded to the front and back surfaces of an aluminum plate, an aluminum plate (JIS#5182) is used as a part of the CAC material. However, since the linear expansion coefficient of the aluminum plate is $23.8 \times 10^{-6}/°$C. and higher compared to the copper foil ($16.5 \times 10^{-6}/°$ C.) as the constituent material of the substrate and the polymerized prepreg (C stage: 12 to $18 \times 10^{-6}/°$ C.), a phenomenon (scaling change) where the board size before and after pressing is different than the designed size will occur. This will lead to the misalignment of the circuit in the in-plane direction, and there is a problem in that this will become a cause for deteriorating the production yield.

The linear expansion coefficient at normal temperature of the various materials used in the print wiring board is as follows. It is evident that the linear expansion coefficient of the aluminum plate is fairly higher than the other materials.

Copper foil: 16.5 ($\times 10^{-6}/°$ C.)
SUS304: $17.3 \times 10^{-6}/°$ C.
SUS301: $15.2 \times 10^{-6}/°$ C.
SUS630: $11.6 \times 10^{-6}/°$ C.
Prepreg (C stage): 12 to $18 \times 10^{-6}/°$ C.
Aluminum plate (JIS#5182): $23.8 \times 10^{-6}/°$ C.

Not directly related to the present invention, there are the following documents as examples related to an ultrathin copper foil with a carrier (Patent Document 2, Patent Document 3, and Patent Document 4).

[Patent Document 1] Japanese Patent No. 3100983
[Patent Document 2] Japanese Published Unexamined Application No. 2005-161840
[Patent Document 3] Japanese Published Unexamined Application No. 2007-186797
[Patent Document 4] Japanese Published Unexamined Application No. 2001-140090

SUMMARY OF THE INVENTION

The present invention was devised in view of the foregoing circumstances, and relates to a copper foil with a carrier that is used in producing a single-sided or multilayer laminated body of two or more layers for use in a print wiring board, and particularly relates to a copper foil with a carrier to be used upon producing a laminated plate. Thus, an object of this invention is to realize improvement in the handling ability during the production process of a printed board and cost reduction based on an improved production yield.

As a result of intense study to achieve the foregoing object, the present inventors discovered that the workability will improve by causing the carrier supporting the copper foil to be larger than the area of the copper foil.

Based on this discovery, the present invention provides:
1) A metal foil with a carrier as a laminated body in which a carrier A and a metal foil B are placed alternately, wherein the carrier A and the metal foil B respectively have a glossy surface ('glossy surface' as used herein represents 'S surface', and both of the expressions are used interchangeably hereinafter), and the respective glossy surfaces are laminated to face each other;
2) The metal foil with a carrier according to 1) above, wherein the carrier A and the metal foil B are rectangular;

3) The metal foil with a carrier according to 1) or 2) above, wherein the metal foil B is a copper foil or a copper alloy foil; and 4) A copper foil with a carrier as a laminated body in which a carrier A and a metal foil B are placed alternately, wherein the carrier A and the metal foil B are subject to ultrasonic bonding.

The present invention additionally provides:

5) The copper foil with a carrier according to any one of 1) to 3) above as a laminated body in which a carrier A and a metal foil B are placed alternately, wherein the carrier A and the metal foil B are subject to ultrasonic bonding;

6) A copper foil with a carrier, wherein a carrier A is a copper foil or a copper alloy foil, a metal foil B is a copper foil or a copper alloy foil, and a rough surface of the copper foil of the carrier A and a glossy surface of the copper foil of the metal foil B are subject to ultrasonic bonding;

7) The copper foil with a carrier according to any one of 1) to 6) above, wherein the carrier A is an aluminum or copper or copper alloy foil, and the metal foil B is a copper foil or a copper alloy foil; and 8) The metal foil with a carrier according to any one 1) to 7) above, wherein the carrier A and the metal foil B are bonded by way of an adhesive, caulking, bi-fold or welding so that they do not become misaligned.

The present invention further provides:

9) The metal foil with a carrier according to any one of 1) to 8) above, wherein the metal foil is an electrolytic foil with a thickness of 5 to 120 μm;

10) The metal foil with a carrier according to any one of 1) to 8) above, wherein the metal foil is a rolled foil with a thickness of 5 to 120 μm; and 11) The metal foil with a carrier according to any one of 1) to 10) above, wherein the coefficient of thermal expansion of the carrier is within the range of +10% and −30% of the coefficient of thermal expansion of the metal foil.

The first feature of the metal foil with a carrier of the present invention is a laminated body in which a carrier A and a metal foil B are placed alternately, wherein the carrier A and the metal foil B respectively have a glossy surface, and the respective glossy surfaces are laminated to face each other. Since the rough surface of both the carrier A and the metal foil B can be used, the work efficiency will improve dramatically since the worker no longer needs to perform reversing operations of placing the M surface of the copper foil on bottom or top.

Although the use of a copper foil as the carrier is optional, if the carrier is made of copper foil, the linear expansion coefficient will be of the same level as the copper foil as the constituent material of the substrate and the polymerized prepreg, and, since the misalignment of the circuit will not occur, the present invention yields a superior effect of minimizing defective goods and thereby improve the production yield.

The second feature of the copper foil with a carrier of the present invention is that it has a structure where the metal foil B is subject to ultrasonic bonding so as to come in contact with the carrier A made of aluminum or copper or copper alloy. The peeling of the aluminum layer after lamination is facilitated, and an effect is yielded in that it is possible to prevent the peeled copper foil from breaking and the aluminum carrier from remaining on the copper foil.

In particular, it is effective if the carrier A is a rolled copper foil or an electrolytic copper foil, and the glossy surface of the copper foil B is subject to ultrasonic bonding so as to come in contact with the roughened surface of the rolled copper foil or the rough surface or the roughened surface of the electrolytic copper foil.

Moreover, based on the selection of the material of the carrier A and the metal foil B; especially, by selecting the material and the surface state, the peelability upon separating the bond can be improved. Accordingly, an effect is yielded in that these can be arbitrarily combined and used.

DETAILED DESCRIPTION OF THE INVENTION

Generally, a printed circuit board is basically configured from a dielectric material referred to as a "prepreg" that is obtained by impregnating synthetic resin in a base material such as a synthetic resin plate, glass plate, nonwoven glass fabric or paper. A sheet such as a copper or copper alloy foil having electrical conductivity is bonded with the prepregs. A laminate that is assembled as described above is generally referred to as a CCL, namely, a Copper Clad Laminate material. In substitute for the foregoing copper or copper alloy foil that is used generally as the CCL material, other foils made of aluminum, nickel, zinc or the like are sometimes used. In the foregoing case, the foil thickness is roughly 5 to 200 μm.

Figure 1:
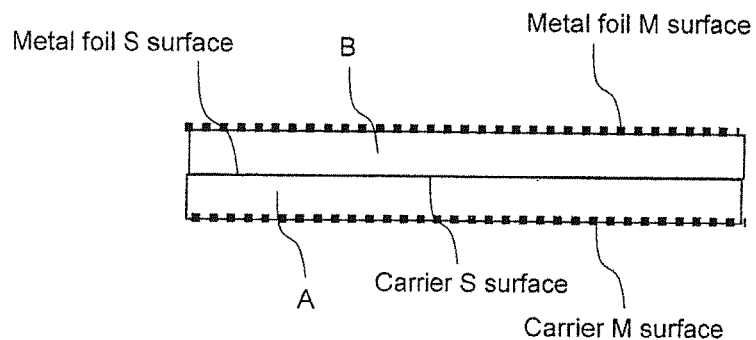
FIG. 1 is an explanatory diagram of the copper foil with a carrier of the present invention in which the glossy surface (S surface) of the carrier A and the glossy surface (S surface) of the metal foil B are mutually laminated.
Figure 2:
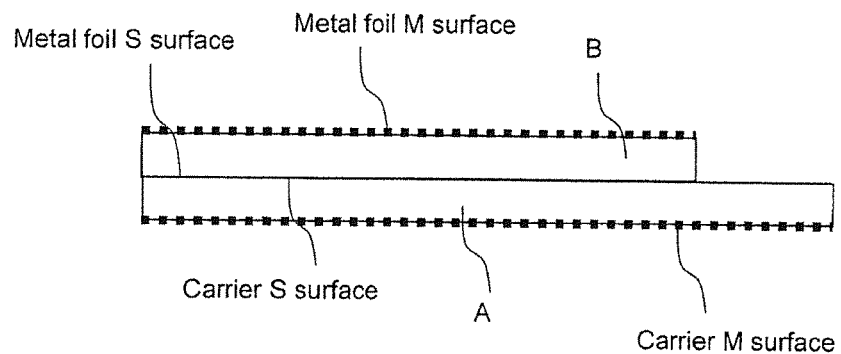
FIG. 2 is a conceptual explanatory diagram of the metal foil with a carrier of the present invention comprising a structure in which a copper foil, a prepreg, a core material, and a copper foil are placed one on top of another, the glossy surface (S surface) of the carrier A and the glossy surface (S surface) of the metal foil B are mutually laminated, and the edge of the carrier A partially protrudes from the metal foil B.

The metal foil with a carrier of the present invention is shown in FIG. 1. With the metal foil with a carrier shown in FIG. 1, the carrier is shown as A and the metal foil is shown as B. Although they look similar to the foregoing CCL material structurally, as for the metal foil with a carrier of the present invention, since the carrier A and the metal foil B are separated eventually, they can be easily peeled mechanically. On this point, since the CCL material cannot be peeled, the structure and function thereof are completely different from the present invention.

With the metal foil with a carrier of the present invention, the carrier A and the metal foil B respectively have a glossy surface, and the respective glossy surfaces are laminated to face each other. Note that the rough surface or the roughened surface of the carrier A can be used, as needed, which is described later. Specifically, in the case of a rolled copper foil, since the rolled surface is the glossy surface, this can be subject to roughening treatment and then used. Moreover, in the case of an electrolytic copper foil, the glossy surface or the rough surface can be further subject to roughening treatment and used as the carrier A.

Moreover, based on the selection of the material of the carrier A and the metal foil B; especially, by selecting the material and the surface state, the peelability upon separating the bond can be improved. Accordingly, these can be arbitrarily combined and used. It is extremely effective to use the ultrasonic welding method for bonding either surface.

Bonding using the ultrasonic welding method has an effect in that it is possible to prevent the copper foil after peeling and separation from breaking and the aluminum carrier from remaining on the copper foil during the process of peeling and separating the copper carrier A from the metal foil B.

In FIG. 1, the upper metal foil B has an upper surface using a copper foil, for example, as the M surface and a lower surface as the S surface, and the lower carrier A has an upper surface as the S surface and the lower surface as the M surface, and the S surfaces thereof are mutually bonded.

In the foregoing case, if the carrier A and the metal foil B are foils made of the same material, the respective front and back rough surfaces of the carrier A and the metal foil B during layup can be used without having to perform any reversing operations. This enables the considerable improvement in workability.

Conventionally, when a worker had to place the M surface of the copper foil on top and place the M surface on bottom in the layup (lamination) process and alternately repeat this process, a problem that the work efficiency would deteriorate arose, but the present invention yields an effect of resolving this problem at once.

Figure 4:
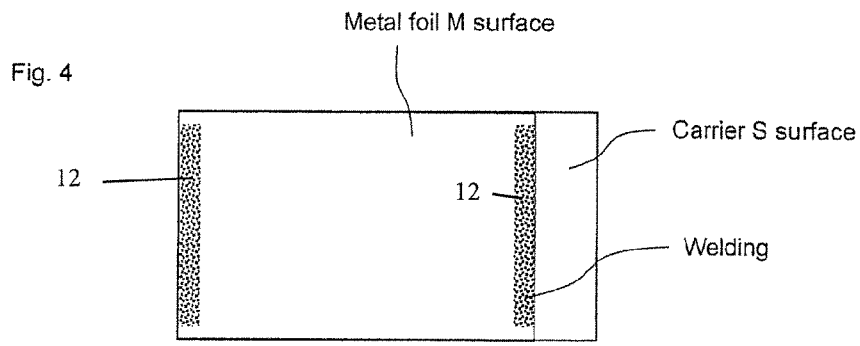
FIG. 4 is an explanatory diagram showing a state of comprising a structure where the edge of the carrier A partially protrudes from the metal foil B and the glossy surface (S surface) of the carrier A and the glossy surface (S surface) of the metal foil B are mutually laminated.

In normal circumstances, the carrier A and the metal foil B are formed in a quadrilateral, namely, a rectangular or a square. Although this shape is selectable so as long as handling is convenient during its manufacture, a square or a rectangular is generally used. Moreover, it is also possible to adopt a structure where the carrier A protrudes from the metal foil B by enlarging the area of the carrier A to be larger than the metal foil B. See FIG. 4 and see "welding" 12. In the foregoing case, it is possible to facilitate the differentiation of a laminated pair of the carrier A and the metal foil B from a similar type of laminated pair of the carrier A and the metal foil B, and facilitate the peeling process by providing a part (edge or end) which differs in dimension upon peeling the carrier A from the metal foil B. In summary, the present invention yields an effect of improving the handling performance of workers considerably compared to conventional processes, and the prominence of the present invention is evident.

The carrier A and the metal foil B are mutually bonded to avoid misalignment, and these are desirably bonded by way of an adhesive, caulking, bi-fold or welding. The bonding method is also selectable, but the foregoing bonding methods are preferred.

Figure 3:
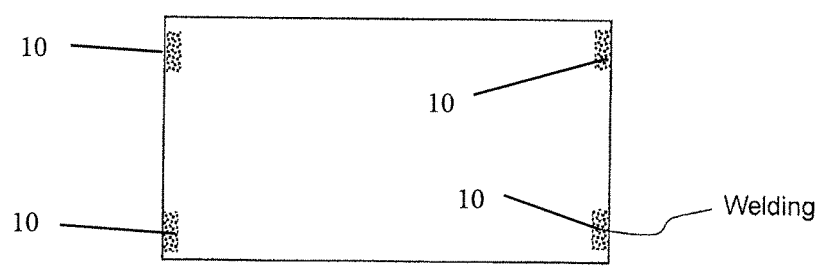
FIG. 3 is an explanatory diagram showing the bond part of the carrier A and the metal foil B of the present invention.

FIG. 3 shows an example where the glossy surface of the carrier (for example, copper foil) A is placed on top and the glossy surface of the metal (copper) foil B is placed on bottom and welded based on ultrasonic welding. Specifically, FIG. 3 shows a state where the glossy surfaces of the carrier and the metal foil are bonding in a manner of facing each other.

In the foregoing case, since the structure is such that the carrier A protrudes from the metal foil B by enlarging the area of the carrier A to be larger than the metal foil B, a part of the glossy surface of the carrier A, for example, copper foil, is exposed on the right side. Moreover, the rough surface of the metal (copper) foil B can be seen as the back side.

Accordingly to the above, since the carrier A and the metal foil B are fixed, the worker's layup process, or lamination process in other words, is effectively improved. And, since the surface is not fixed entirely, the process of peeling or scaling, in other words after lamination is also facilitated As the metal foil B, a copper foil or a copper alloy foil is a typical example and most favorable, but foils of aluminum, nickel, zinc and the like may also be used. Similarly, a foil of the same material as the metal foil B can be used as the carrier A.

In the case of a copper foil or a copper alloy foil, an electrolytic foil or a rolled foil with a thickness of 5 to 120 μm can be used.

Moreover, the coefficient of thermal expansion of the carrier A is desirably within the range of +10% and −30% of the coefficient of thermal expansion of the metal foil B. Consequently, it is possible to effectively prevent the misalignment of the circuit caused by the difference in thermal expansion, and thereby minimize defective goods and improve the production yield. Generally, since the carrier A and the metal foil B are mechanically peeled before such a process as plating and etching, the peel strength thereof is desirably 1 g/cm or more and 1 kg/cm or less. The peeling surface is desirably the boundary of the carrier A and the metal foil B. The residue of other material will require a removal work thereof and cause the overall process to be complicated, and must be avoided.

EXAMPLES

The Examples of the present invention are now explained. Note that these Examples are presented for facilitating the understanding of the invention, and the invention is not limited to the Examples. The present invention should be understood from the requirements described in the claims and the overall technical concept described in the specification, and the present invention covers all of the above.

Example 1

A prepreg prepared from epoxy resin was used as the resin material. An intended number of prepregs were laminated on the metal foil with a carrier, a two-layer printed circuit board referred to as an inner layer core was subsequently laminated thereon, a prepreg was subsequently laminated thereon, and a metal foil with a carrier was further formed thereon, in the foregoing order, in order to complete one set of a four-layer substrate material assembly unit.

Subsequently, this unit called "page" was repeatedly laminated about 10 times to configure a press assembly called "book".

Figure 5:
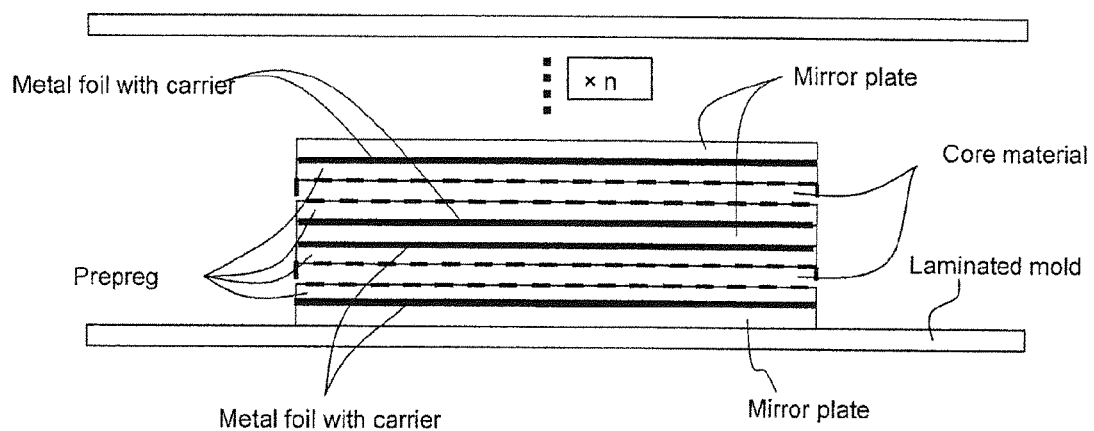
FIG. 5 is an explanatory diagram showing a state of forming a copper foil layer as the outermost layer by hot pressing a copper foil with a carrier comprising a structure in which a copper foil, a prepreg, a core material, and a copper foil are placed one on top of another, and in which the glossy surface of the carrier A and the glossy surface of the metal foil B are mutually bonded.

The present invention is unique about the structure of the metal foil with a carrier, and copper is used both as the carrier A and as the metal foil B and the glossy surfaces thereof are mutually bonded. FIG. 5 shows this structure.

FIG. 5 shows a case of forming a four-layer substrate unit called "page" obtained by laminating, one on top of the other, a metal foil with a carrier, intended number of prepregs, two-layer printed circuit board as an inner layer core, prepreg, and further a metal foil with a carrier.

FIG. 5 shows a state of further stacking this with a mirror plate of an intermediate plate interposed therebetween (2 levels in FIG. 5). In normal circumstances, this is repeated about 10 times to prepare an assembly called "book" to be pressed. Note that "xn" in FIG. 5 shows a multilayer (n=1, 2, 3 . . . n).

All of these laminated bodies are aligned. A rolled copper foil was used as the carrier A, and an electrolytic copper foil was used as the metal foil B. Subsequently, the respective glossy surfaces were bonded using the ultrasonic welding method. The bonding place 10 was the position shown in FIG. 3. As described above, it was possible to seek considerable improvement in the work efficiency at the previous step of preparing the assembly to be pressed. Specifically, since the rough surface of both the carrier A and the metal foil B can be used, the work efficiency improved dramatically since the worker no longer needs to perform reversing operations of placing the M surface of the copper foil on bottom or top.

This book was thereafter set in a hot press and subject to compression molding at a prescribed temperature and pressure to produce a four-layer substrate. Note that substrates with four or more layers can be generally produced by a similar process by increasing the number of layers of the inner layer core.

The laminated plate prepared as described above was formed into a completed product by peeling and separating the carrier from copper foil, and subsequently forming a circuit by undergoing the plating process and/or etching process. Since the entire surface of the metal foil B is supported with the carrier A, the metal foil was completely free of wrinkles during the lamination.

In addition, since a copper alloy foil was used as the carrier A and copper was used as the metal foil B, the linear expansion coefficient was basically the same level as the copper foil as the constituent material of the substrate and the polymerized prepreg. Thus, the misalignment of the circuit did not occur. Accordingly, it was possible to minimize defective goods and thereby improve the production yield compared to cases of using a conventional CAC.

Example 2

As with Example 1, a rolled copper foil was used as the carrier A, and an electrolytic copper foil was used as the metal foil B, and the respective glossy surfaces were mutually bonded. Since the structure is the same as the structure shown in FIG. 5, the explanation thereof is omitted.

FIG. 5 shows a case of forming a four-layer substrate unit called "page" obtained by laminating, one on top of the other, a metal foil with a carrier, intended number of prepregs, two-layer printed circuit board as an inner layer core, prepreg, and further a metal foil with a carrier. FIG. 5 shows a state of further stacking this with a mirror plate (intermediate plate) interposed therebetween (2 levels in FIG. 4). In normal circumstances, this is repeated about 10 times to prepare an assembly called "book" to be pressed. Note that "xn" in FIG. 5 shows a multilayer (n=1, 2, 3 . . . n).

These laminated bodies were aligned, and a rolled copper alloy foil of 35 μm was used as the carrier A, in this example, brass containing 65% copper and 35% zinc was used), a rolled copper foil of 5 μm was used as the metal foil B, and these were bonded using an epoxy adhesive. The bonding place was the position shown in FIG. 3.

Conventionally, at the stage of preparing this set of four-layer substrate material assembly unit, it was necessary to reverse the metal foil with a carrier, but since the rough surface of both the carrier A and the metal foil B can be used, the foregoing reversing operation was not required. Thus it was possible to seek considerable improvement in the work efficiency at the previous step of preparing the assembly to be pressed. Subsequently, this book was thereafter set in a hot press and subject to compression molding at a prescribed temperature and pressure to produce a four-layer substrate. Note that substrates with four or more layers can be generally produced by a similar process by increasing the number of layers of the inner layer core.

The laminated plate prepared as described above was formed into a completed product by peeling and separating the carrier from copper foil, and subsequently forming a circuit by undergoing the plating process and/or etching process. Since the entire surface of the metal foil B is supported with the carrier A, the metal foil was completely free of wrinkles during the lamination.

In addition, since a copper alloy foil was used as the carrier A and copper was used as the metal foil B, the linear expansion coefficient was basically the same level as the copper foil as the constituent material of the substrate and the polymerized prepreg. Thus, the misalignment of the circuit did not occur. Accordingly, it was possible to minimize defective goods and thereby improve the production yield compared to cases of using a conventional CAC.

Example 3

The roughened surface of the rolled copper foil of the carrier A and the S surface of the electrolytic copper foil of the metal foil B were bonded using the ultrasonic welding method. Otherwise, a book was prepared as with Example 1, and the foregoing book was placed in a hot press and subject to compression molding at a prescribed temperature and pressure to produce a four-layer substrate. The laminated plate prepared as described above was formed into a completed product by forming a circuit by undergoing the plating process and/or etching process, and further peeling and separating the carrier from the copper foil.

With this peeling and separation, in the case of Example 2, the copper foil after the peeling and separation had slightly ruptured and the copper carrier slightly remained on the copper foil, but the configuration of this Example did not result in any rupture of the copper foil or residual copper carrier on the copper foil.

Accordingly, it was discovered that it is extremely effective to bond the roughened surface of the rolled copper foil of the carrier A and the S surface of the electrolytic copper foil of the metal foil B using the ultrasonic welding method.

Example 4

An electrolytic copper foil was used as the carrier A. An electrolytic copper foil has a rough surface and a glossy surface, but here, the rough surface of the electrolytic copper foil and the S surface of the electrolytic copper foil of the metal foil B were bonded using the ultrasonic welding method. Otherwise, a book was prepared as with Example 1, and the foregoing book was placed in a hot press and subject to compression molding at a prescribed temperature and pressure to produce a four-layer substrate. The laminated plate prepared as described above was formed into a completed product by forming a circuit by undergoing the plating process and/or etching process, and further peeling and separating the carrier from the copper foil.

As with Example 3, the configuration of this Example did not result in any rupture of the copper foil or residual copper carrier on the copper foil.

Accordingly, it was discovered that it is extremely effective to bond the rough surface of the electrolytic copper foil of the carrier A and the S surface of the electrolytic copper foil of the metal foil B using the ultrasonic welding method.

Example 5

An aluminum rolled foil was used as the carrier A, and the aluminum rolled foil and the S surface of the electrolytic copper foil of the metal foil B were bonded using the ultrasonic welding method. Otherwise, a book was prepared as with Example 2, and the foregoing book was placed in a hot press and subject to compression molding at a prescribed temperature and pressure to produce a four-layer substrate. The laminated plate prepared as described above was formed into a completed product by forming a circuit by undergoing the plating process and/or etching process, and further peeling and separating the carrier from the copper foil.

As with Example 3, the configuration of this Example did not result in any rupture of the copper foil or residual copper carrier on the copper foil during the peeling and separation process.

A copper foil or a copper alloy foil is normally used as the metal foil B, but it goes without saying that other metal foils may be used as the metal foil B. Moreover, as the carrier A, a copper foil or a copper alloy foil or an aluminum foil is used. In the foregoing case, rolled aluminum foil is used as the foregoing aluminum.

As the copper foil, there is a rolled copper foil and an electrolytic copper foil, and here, either may be used as the carrier A of the present invention. The glossy surface of the rolled copper foil and the electrolytic copper foil may be used, or the rough surface thereof may be used.

In the case of a rolled copper foil, since the rolled surface is the glossy surface, this may be used upon performing roughening treatment thereto. Moreover, in the case of an electrolytic copper foil, the glossy surface or the rough surface may be further subject to roughening treatment and used as the carrier A.

Moreover, based on the selection of the material of the carrier A and the metal foil B; especially, by selecting the material and the surface state, the peelability upon separating the bond can be improved. Accordingly, these can be arbitrarily combined and used.

The metal foil with a carrier of the present invention is characterized in that it is a laminated body in which a carrier A and a metal foil B are placed alternately, and the glossy surface of the carrier A and that of the metal foil B are placed one over another, and the work efficiency will improve dramatically since the worker no longer needs to perform reversing operations of placing the M surface of the copper foil on bottom or top.

In addition, although the use of a copper foil as the carrier is optional, the linear expansion coefficient will be of the same level as the copper foil as the constituent material of the substrate and the polymerized prepreg if the carrier is made of copper foil, and, since the misalignment of the circuit will not occur, the present invention yields a superior effect of being able to minimize defective goods and thereby improve the production yield.

Significant advantages are yielded by the metal foil with a carrier obtained with the present invention, and this metal foil with a carrier is particularly effective for producing a printed circuit board.

The invention claimed is:

1. A metal foil with a carrier as a laminated body, comprising a carrier A and a metal foil B, wherein the carrier A and the metal foil B respectively have a glossy surface S, said surfaces S of the carrier A and the metal foil B are laminated to face each other, wherein the carrier A protrudes and extends beyond a peripheral edge of the metal foil B, wherein the carrier A is ultrasonically bonded directly to the metal foil B at two separate equally extending continuous weldings, one of said weldings extending adjacent the peripheral edge of the metal foil B from which the carrier A protrudes and the other of said weldings extending adjacent an opposite peripheral edge of the metal foil B, the carrier A being mechanically peelable from the metal foil B.

2. A laminated body comprising the metal foil with a carrier according to claim 1, further comprising a first prepreg laminated on the metal foil with carrier, a two-layer printed circuit board laminated on the first prepreg, a second prepreg laminated on the two-layer printed circuit board and a second metal foil with carrier according to claim 1 formed on the second prepreg.

3. The metal foil with a carrier according to claim 1, wherein the metal foil B is a copper foil or a copper alloy foil.

4. The metal foil with a carrier according to claim 1, wherein the carrier A and the metal foil B are rectangular.

5. The metal foil with a carrier according to claim 4, wherein the metal foil B is a copper foil or a copper alloy foil.

* * * * *